July 28, 1970 P. L. VITKUS 3,522,043

METHOD FOR MASKING ELECTROLUMINESCENT DIODE

Filed Dec. 7, 1966

United States Patent Office 3,522,043

Patented July 28, 1970

3,522,043

METHOD FOR MASKING ELECTRO-LUMINESCENT DIODE

Paul L. Vitkus, Bedford, Mass., assignor, by mesne assignments, to Norton Research Corporation Filed Dec. 7, 1966, Ser. No. 599,716
Int. Cl. G03c *5/00*
U.S. Cl. 96—35.1 4 Claims

ABSTRACT OF THE DISCLOSURE

A photoresist is used for preparing a mask on a predetermined section of an electroluminescent junction diode, the photoresist being differentially exposed by light emitted from the diode along the junction.

The present invention is directed to the production of masked electroluminescent diodes particularly for use in recording sound on photographic film.

In the production of sound movies or for recording high density of data on photographic film, it is desirable to have the light emitted from a light source having the narrowest possible dimension parallel to the dimension of movement of the film. For ultimate frequency response, the emitting area of the diode is desirably kept to an absolute minimum. While a properly polished silicon carbide diode will have fairly sharply peaked output from an edge normal to the junction, it is desired, for recording the highest frequencies, to trim the edges of the peaked output of the light by superimposing a mask on the polished edge of the diode. Since the diode is extremely small and the exact location of the junction is difficult to identify, alignment of a mask with the junction can be a tedious task. In accordance with the present invention, the area of maximum light emission from the junction is located by spreading a photoresist material on the light-emitting edge and then energizing the junction to cause an emission of light. Where the photoresist is most heavily exposed, it will be differentially developable. If the exposed photoresist remains after development, it can be used to mask an etching or deposition technique. Where the exposed photoresist material is removed during the development, as in a reversal technique, the remainder of the photoresist material may be converted to the mask.

Figure 1:
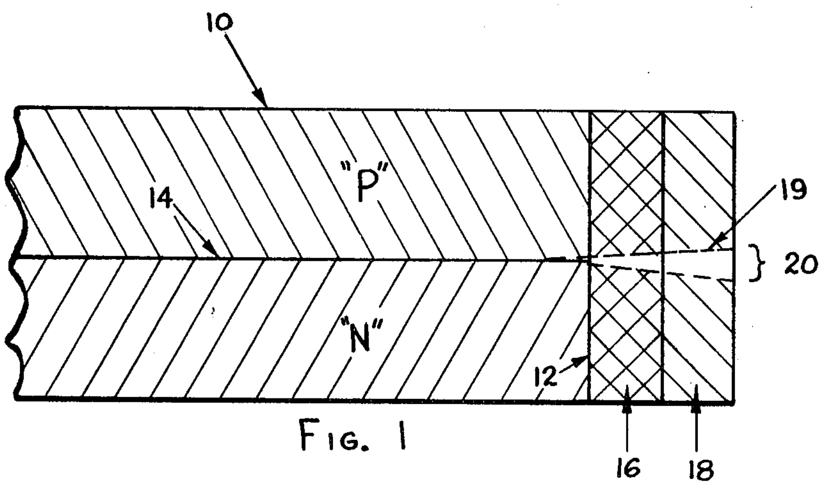
Figure 2:
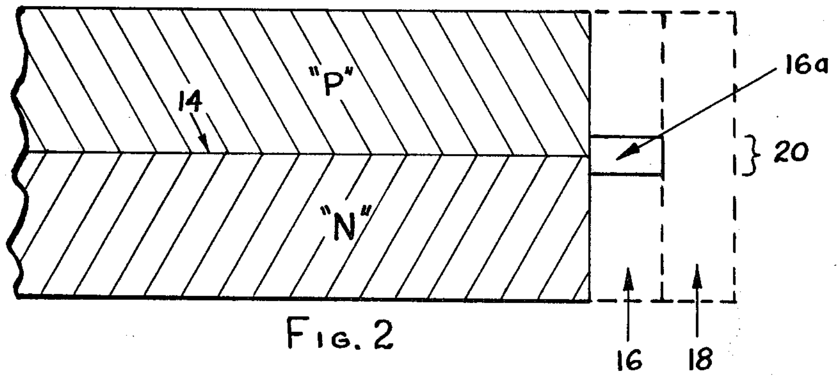
Figure 3:
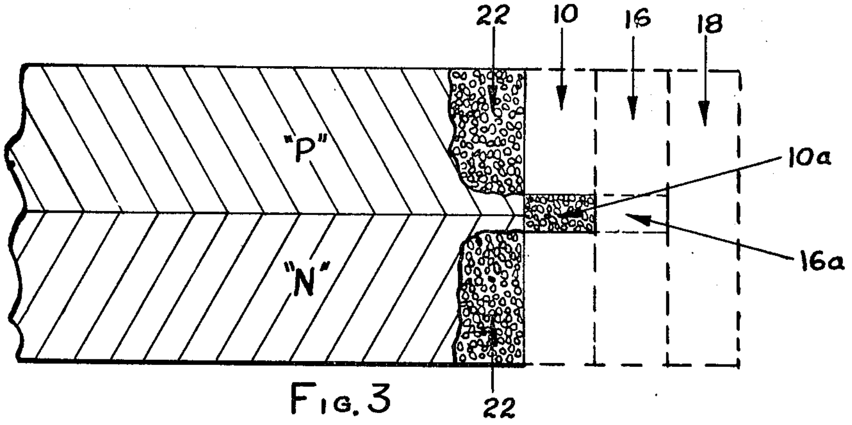

In order that the invention may be more fully understood, reference should be had to the following detailed description considered in connection with the accompanying drawing wherein FIGS. 1, 2 and 3 are diagrammatic, schematic, sectional views of one preferred method of practicing the invention as set forth in the following example:

EXAMPLE 1

In this case, a silicon carbide junction diode 10 (FIG. 1) is prepared as described in Vitkus U.S. Pat. 3,462,321, the *p* layer being preferably heavily doped. The mask is to be formed on an edge 12 of the junction diode which is perpendicular to the plane 14 of the junction. This edge 12 is first uniformly oxidized to provide a silicon dioxide layer 16 about 1 micron thick, this oxidation preferably comprising a thermal oxidation step. Alternatively, the $SiO_2$ layer is formed by pyrolytic decomposition. Thereafter a layer 18 of photoresist such as KOR or KPR is spread over the silicon dioxide layer. The diode is then illuminated by passing a current through the diode in the forward direction. Since the light 19 emitted from the diode is more strongly concentrated immediately adjacent the junction, this portion 20 of the photoresist receives the greatest amount of exposure. By controlling the amount of photoresist, time of exposure and the amount of current for a given diode, there can be obtained a carefully and narrowly defined exposed line 20 of photoresist. The unexposed photoresist is removed during the development of the exposed photoresist. The uncovered portions of the silicon dioxide are then etched away by exposure to a solution of hydrofluoric acid. Thereafter the remaining photoresist is removed, leaving a silicon carbide surface having a fine $SiO_2$ line 16*a* (FIG. 2) adjacent the junction. The exposed silicon carbide is then uniformly etched with hot chlorine to a depth of 5 to 10 microns leaving a mesa 10*a* (FIG. 3) underlying the strip of $SiO_2$. The $SiO_2$ is next removed by etching in HF. Thereafter an opacifying impurity such as phosphorus or nitrogen is diffused into the whole edge of the crystal. This diffusion is preferably carried out in a furnace at about 2000° C.–2500° C. for 10–120 minutes in an atmosphere of helium or argon containing a partial pressure of the impurity. The diffusion is terminated before the impurity penetrates to the junction. This converts all of the edge of the silicon carbide crystal into an opaque layer (shown as the dotted region 22 in FIG. 3). The mesa 10*a* overlying the junction is then ground off to remove the opaque layer in the mesa. Thereafter the edge of the diode is repolished.

EXAMPLE 2

In this case the procedure is somewhat similar to that in Example 1 except that a reversal technique is used in the development of the KPR.

After the exposed KPR has been removed during the reversal development, the remaining KPR is dyed black by the use of a black dye, thereafter the KPR is baked at 250° C. for 5 minutes to form a hard lacquer opaque mask.

While several preferred examples have been given above, numerous modifications thereof are feasible. Many mask-forming techniques can be employed and the invention may be utilized with electroluminescent diodes other than silicon carbide.

Since certain changes can be made in the above process without departing from the scope of the invention herein involved, it is intended that all matter contained in the above description shall be interpreted as illustrative and not in a limiting sense.

What is claimed is:

1. The process of forming a mask to limit the area of light emitted from the edge of a light-emitting junction diode which comprises coating said edge with a photoresist material, passing current through the diode to generate light along said edge, the light being most intense adjacent the junction, and utilizing the most intensely exposed portions of said photoresist to define a mask-free area in a subsequent masking operation.

2. The process of claim 1 wherein the unexposed portions of the resist are removed, the exposed portions remain in place during the mask-forming operation and the exposed portions of the resist are removed after the mask-forming operation.

3. The process of claim 1 wherein the exposed portions of the resist are removed and the unexposed portions of the resist are converted into a mask.

4. The process of claim 1 wherein the junction diode consists of a silicon carbide p–n junction.

References Cited

UNITED STATES PATENTS

| | | | |
|---|---|---|---|
| 3,290,539 | 12/1966 | La Morte | 313—114 |
| 3,384,556 | 5/1968 | Ronde. | |

DONALD LEVY, Primary Examiner

M. B. WITTENBERG, Assistant Examiner

U.S. Cl. X.R.

96—27, 35, 36.2, 38.4, 44; 156—17